(12) United States Patent
Dietrich et al.

(10) Patent No.: US 6,272,035 B1
(45) Date of Patent: Aug. 7, 2001

(54) INTEGRATED MEMORY

(75) Inventors: Stefan Dietrich, Türkenfeld; Peter Schrögmeier, München; Torsten Partsch, München; Christian Weis, München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/618,124

(22) Filed: Jul. 17, 2000

(30) Foreign Application Priority Data

Jul. 16, 1999 (DE) .............................. 199 33 539

(51) Int. Cl.[7] .................................................. G11C 5/06
(52) U.S. Cl. .................. 365/63; 365/51; 365/230.03; 365/230.04; 365/233
(58) Field of Search ................ 365/63, 51, 230.03, 365/233, 230.04

(56) References Cited

U.S. PATENT DOCUMENTS

| | | | |
|---|---|---|---|
| 5,517,462 | * 5/1996 | Iwamoto et al. | 365/233 |
| 6,067,260 | * 5/2000 | Ooishi et al. | 365/230.03 |
| 6,134,153 | * 10/2000 | Lines et al. | 365/230.04 |
| 6,144,577 | * 11/2000 | Hidaka | 365/63 |

FOREIGN PATENT DOCUMENTS

19652870A1   6/1997  (DE) .

OTHER PUBLICATIONS

"a 2.5–ns Clock Access, 250–MHz, 256–Mb SDRAM with Synchronous Mirror Delay", Takanori Saeki et al., IEEE Journal of Solid–State Circuits, vol. 31, No. 11, Nov. 1996, pp. 1656–1668.

\* cited by examiner

*Primary Examiner*—Huan Hoang
(74) *Attorney, Agent, or Firm*—Herbert L. Lerner; Laurence A. Greenberg; Werner H. Stemer

(57) ABSTRACT

A memory has an input circuit, which is provided adjacent to two groups of memory cells and via which two global data lines are connected to two local data lines. The memory has two operating states during which it feeds the data provided on the global data lines in respective different assignments to the two local data lines.

7 Claims, 4 Drawing Sheets

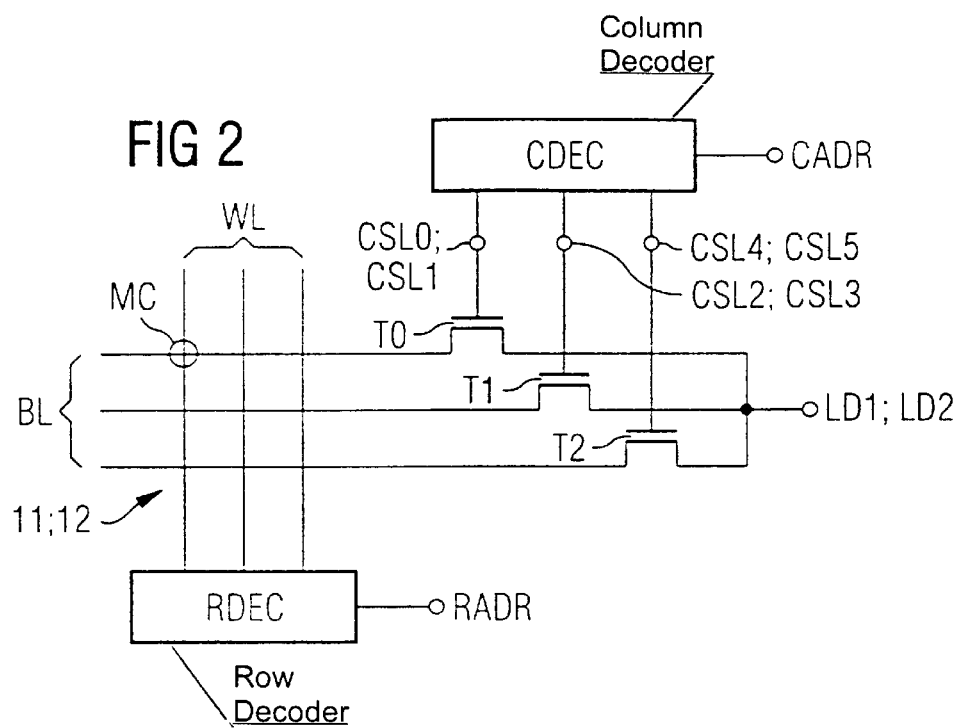
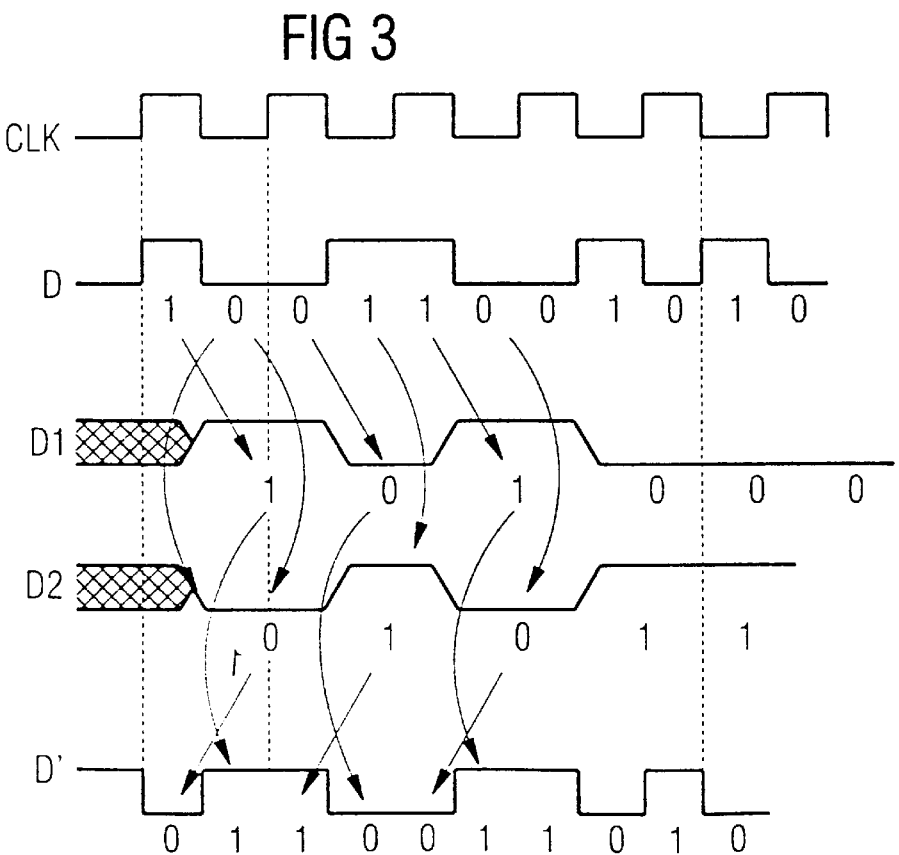

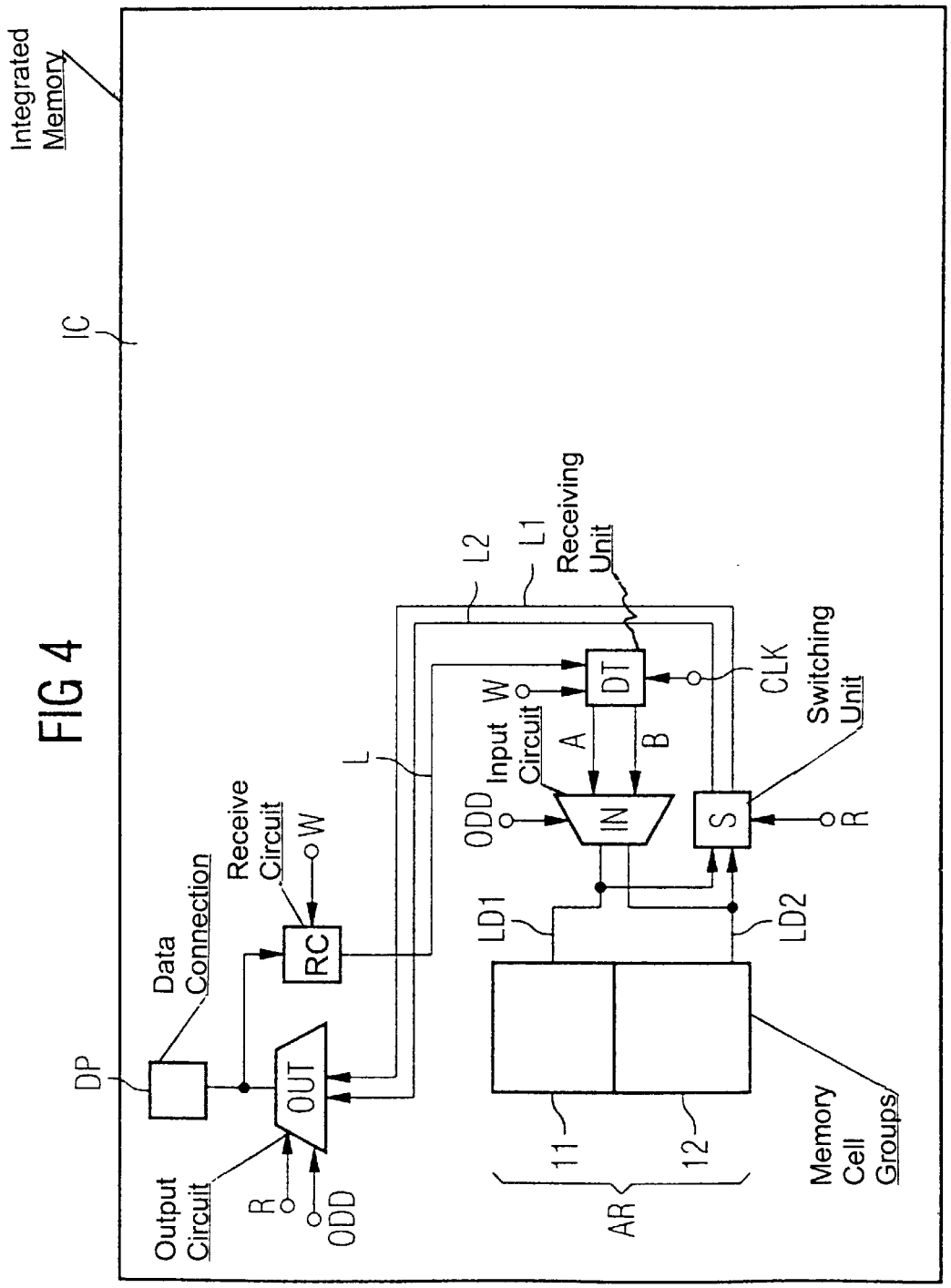

INTEGRATED MEMORY

BACKGROUND OF THE INVENTION

FIELD OF THE INVENTION

The invention relates to an integrated memory in which two items of data which are sequentially fed to the memory can be fed in different assignments in each case to one of two groups of memory cells.

Memory devices of this type include the type known as DDR-SDRAMs (Double Data Rate Synchronous Dynamic Random Access Memories), in which data are read in or out both with the rising edge and with the falling edge of an external clock signal. They contain a first group of memory cells, to which even column addresses are assigned, and a second cell group, to which odd column addresses are assigned. Depending on whether a start address fed to the memory is even or odd, the datum transferred with the rising edge of the external clock signal must be assigned to an even or odd column address, that is to say be stored either in the first or in the second cell group. A second datum received with a subsequent negative clock edge is then fed to the respective other cell group. During read-out from a DDR-SDRAM, two items of data are simultaneously read from the two cell groups. In this case, the order of these items of data upon being output from the memory again depends on whether the start address applied to the memory in the event of read-out is even or odd.

The information as to whether the start address that is present is an even or odd address is taken from the least significant bit (LSB) of the start address. A corresponding control signal for the memory is derived from this address bit.

To date, it has been customary for corresponding input circuits, serving for assigning the successively arriving data to the different cell groups, to be provided directly at the respective data connection. It has also been customary for output circuits, which output the data read simultaneously from the two cell groups in the event of a read access to the memory in the correct order, to be provided directly at the respective data connection.

The control signal derived from the least significant bit of the start address has to be fed both to the input circuit and to the output circuit. Depending on where the control signal is generated, the latter has to be driven via the entire chip in the worst-case scenario, in particular when the data connections are provided at the edge of the memory component. This results in a not inconsiderable propagation delay of the control signal, since the line lengths can be up to several millimeters. This propagation delay limits the maximum operating speed of the memory since, in the event of a write access, the data can be fed to the cell groups only after evaluation of the control signal by the input circuit provided at the data connection. This propagation delay of the control signal is less critical in the event of a read access since the data that are read out, in SDRAMs, are buffer-stored for one or more clock periods in a FIFO store (First IN, First OUT), before being output from the memory. This means that there is enough time available for the decision concerning the order in which the data read from the cell groups are to be output.

SUMMARY OF THE INVENTION

It is accordingly an object of the invention to provide an integrated memory which overcomes the above-mentioned disadvantages of the heretofore-known memory devices of this general type and, in particular, in which the write accesses can be effected more rapidly than in conventional memory devices.

With the foregoing and other objects in view there is provided, in accordance with the invention, an integrated memory, including:

a bidirectional data connection;

two cell groups located adjacent to one another and having memory cells;

a first local data line and a second local data line for a respective bidirectional data transfer from and to the memory cells of a respective one of the two cell groups;

a first global data line and a second global data line for a respective bidirectional data transfer between the data connection and the first and second local data lines;

an output circuit for performing a read access to the two cell groups, the output circuit being located adjacent to the data connection;

the first and second global data lines being connected to the data connection via the output circuit, the output circuit having two operating states for feeding two items of data respectively provided on the first and second global data lines to the data connection in a respective different order;

an input circuit for performing a write access to the two cell groups, the input circuit being located adjacent to the two cell groups;

a receiving unit located at the data connection;

the data connection being connected to the first and second global data lines via the receiving unit, the data connection, in the event of the write access to the two cell groups, being fed a first datum and subsequently a second datum, the receiving unit, in the event of the write access, feeding the first datum to the first global data line and feeding the second datum to the second global data line; and the first and second global data lines being connected to the first and second local data lines via the input circuit, the input circuit having two operating states for feeding the first datum and the second datum in a respectively different assignment to the first and second local data lines.

According to the invention, it is provided that although the output circuit, which, in the event of a read access to the memory, outputs the data read from the two cell groups in the correct order at the data connection, is provided adjacent to the data connection, the input circuit, which, in the event of a write access to the memory, assigns the two items of data arriving successively at the data connection to the respectively correct cell group, is however provided adjacent to the two cell groups. For this purpose, the first datum arriving first at the data connection is, in principle, fed via the first global data line and the subsequently arriving, second datum is fed via the second global data line to the input circuit.

Due to the input circuit not being provided adjacent to the data connection but adjacent to the two cell groups, there is a longer period of time available for the decision as to which datum is to be fed to which cell group than in conventional memories. This is due on the one hand to the fact that the data fed to the data connection in the event of a write access firstly propagate through the entire length of the global data lines before they reach the input circuit, in which the decision for the assignment is made. On the other hand, by virtue of the input circuit not being provided at the data connections, which are usually provided peripherally at the edge of the memory, but rather being provided at the cell groups, which are usually provided closer to the center of the chip, the line length for a control signal which controls the assignment is shortened, with the result that the line propagation delay of the control signal until the control signal reaches the input circuit is shorter than in conventional memories. Consequently, such a control signal arrives faster or earlier at the input circuit, whereas the data to be written arrive there later, than in conventional memory devices. Therefore, there is more time available for the assignment of the data to be written to the two cell groups than in known memory devices, with the result that undesirable waiting times with regard to the assignment are avoided and the write access can be effected without corresponding waiting times, and hence very rapidly, even in the case of data to be written which arrive at a high frequency.

In accordance with another feature of the invention, a control signal is provided, which is fed in each case to a control input of the output circuit and of the input circuit and on which the operating state both of the output circuit and of the input circuit depends.

In accordance with yet another feature of the invention, the memory cells are provided at cross-over points of word lines and bit lines. The memory has switching elements, via which the bit lines of each cell group are connected to the associated local data line and which have control inputs. The first cell group is assigned first column select lines and the second cell group is assigned second column select lines, of which one is activated in each case in the event of a write or read access to the memory and which are each connected to one of the control connections of the switching elements.

In accordance with a further feature of the invention, column select lines can be addressed through the use of column addresses. The first column select lines are assigned even column addresses and the second column select lines are assigned odd addresses.

In accordance with another feature of the invention, the two items of data which are transferred via the data connection in the event of a read access and in the event of a write access are synchronous with two successive edges of a clock signal.

In accordance with yet another feature of the invention, the two successive edges of the clock signal are a positive and a negative edge.

According to another feature of the invention, the input circuit has a third operating state, in which, in the event of a write access, it feeds the first datum simultaneously to both local data lines. This enables a modified operation of the memory device, in which the same datum is fed simultaneously to a plurality of memory cells.

Although the invention is illustrated and described herein as embodied in an integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a schematic circuit diagram of a detail of the memory cell groups included in the memory of FIG. 1;

FIG. 3 is a graph of the signal profiles for write accesses and read accesses in the memory as shown in FIG. 1;

FIG. 4 is a schematic block diagram of an alternative embodiment of an integrated memory according to the invention.

DESCRIPTION OF THE PREFERRED EMBODIMENTS

Figure 1:
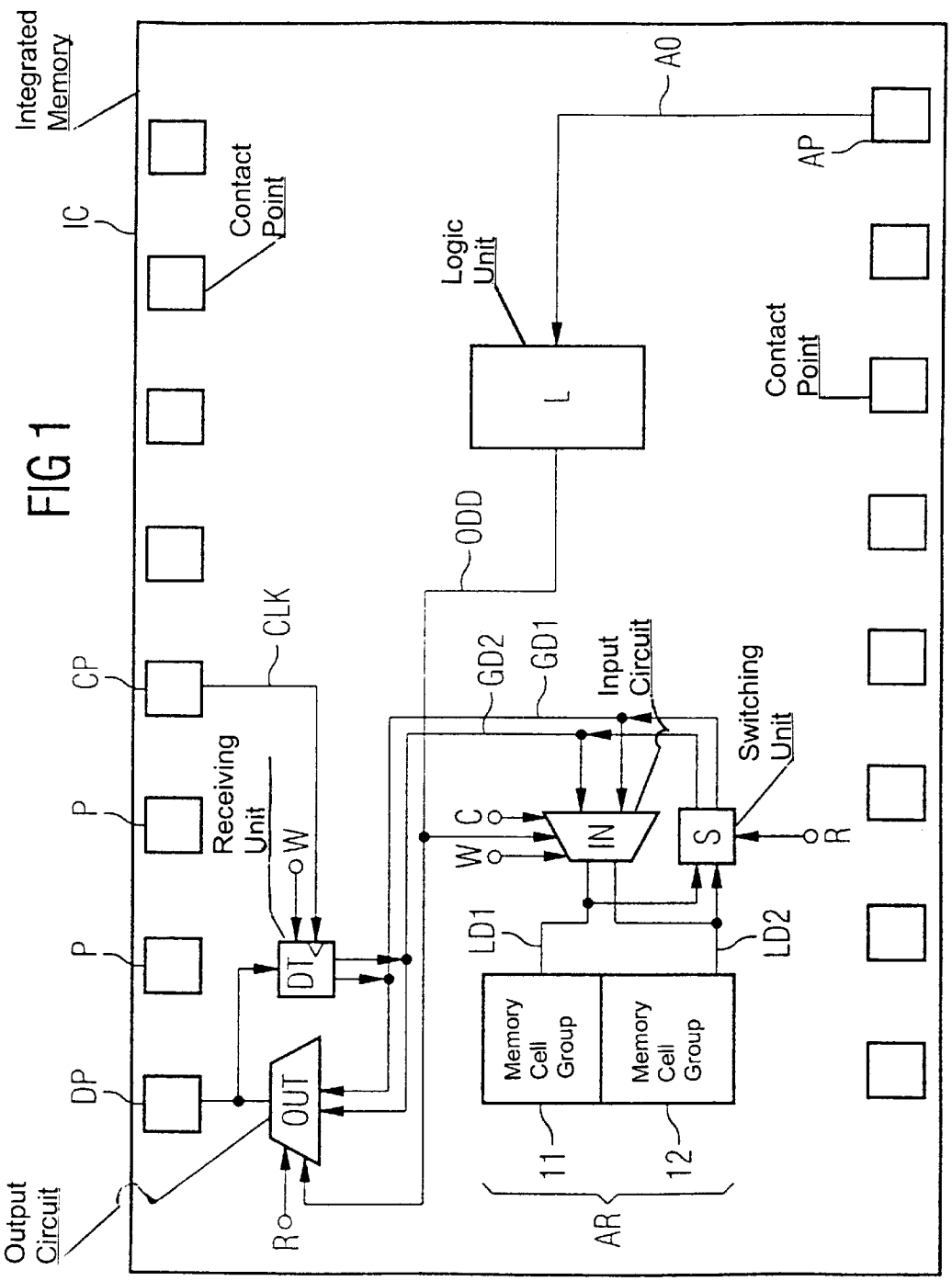
FIG. 1 is a schematic block diagram of a first exemplary embodiment of the memory according to the invention.

Referring now to the figures of the drawings in detail and first, particularly, to FIG. 1 thereof, there is shown an integrated memory IC of the DDR-DRAM type. This memory has two rows of contact-making points P, DP, CP, AP at its edges. The contact-making points include a data connection DP, a clock connection CP and an address connection AP for the least significant bit of a column address sent to the memory IC. The memory has two groups 11, 12 of memory cells which are provided adjacent to one another and form a common memory cell array AR in this exemplary embodiment. The memory cells of the first cell group 11 are assigned even column addresses and those of the second cell group 12 are assigned odd column addresses. The memory cells of the first cell group 11 can be accessed via a first local data line LD1 and the memory cells of the second cell group 12 can be accessed via a second local data line LD2.

FIG. 2 shows the structure of the two cell groups 11, 12. Each cell group has memory cells MC at cross-over points of bit lines BL and word lines WL. The word lines WL can be selected via a row decoder RDEC through the use of row addresses RADR fed to the memory. The bit lines can be selected through the use of a column decoder CDEC by way of column addresses CADR fed to the memory. The bit lines BL are connected via a respective transistor Ti to the local data line LD1, LD2 assigned to the corresponding cell group 11, 12. The outputs of the column decoder CDEC are connected to the control connections of the transistors Ti via first column select lines CSL0, CSL2, CSL4, to which even column addresses CADR are assigned, and, respectively, second column select lines CSL1, CSL3, CSL5, to which odd column addresses CADR are assigned. The circuit illustrated in FIG. 2 is a simplified illustration since, in the case of a DRAM, accesses are usually made to bit line pairs rather than individual bit lines. Furthermore, read amplifiers that are usually present have not been depicted in FIG. 2.

In the case of the memory IC in FIG. 1, the data connection DP is connected to a pair of global data lines GD1, GD2 via a receiving unit DT. Just like an output circuit OUT, the receiving unit DT is provided directly adjacent to the data connection DP. The output circuit OUT connects the two global data lines GD1, GD2 to the data connection DP and serves for outputting data that are to be read out in the event of a read access to the memory IC.

Furthermore, the memory in FIG. 1 has an input circuit IN, which is provided directly adjacent to the two cell groups 11, 12 and connects the two global data lines GD1, GD2 to the two local data lines LD1, LD2. A switching unit S is likewise directly adjacent to the cell groups 11, 12, wherein the switching unit connects the local data lines LD1, LD2 to the global data lines GD1, GD2.

The output circuit OUT and the switching unit S each have a control input connected to a read control signal R. The read control signal R activates these two circuits in the event of read accesses to the memory IC. The receiving unit DT and the input circuit IN each have a control input connected to a write control signal W. The write control signal W activates these two units when a write access is made to the memory IC. Furthermore, a clock input of the receiving unit DT is connected to the clock connection CP. Via the latter, the receiving unit DT is fed an external clock signal CLK, with which data, which are to be written in synchronously in the event of a write access, arrive at the data connection DP. The receiving unit DT contains an edge detector which serves for detecting the positive and negative edges of the clock signal CLK. The receiving unit DT accepts a first datum (item of data) from the data connection DP in the event of a positive edge of the clock signal CLK and a second datum in the event of a succeeding negative edge of the clock signal CLK. The receiving unit DT feeds the first datum to the first global data line GD1 and the second datum to the second global data line GD2. The two items of data are fed in this way to the input circuit IN, from where they are fed in a respectively different assignment to the two local data lines LD1, LD2 in a manner dependent on a control signal ODD.

The control signal ODD is generated by a logic unit L from the least significant address bit A0 of the column addresses CADR. The least significant address bit A0 is fed to the memory IC via the address connection AP. The control signal ODD has a high level if the address bit A0 has a low level, that is to say if the column address CADR that is fed in is even. If the address bit A0 has a high level, that is to say the column address CADR that is fed in is odd, the control signal ODD has a low level. In the case of the high level of the control signal ODD, the input circuit IN feeds the first datum, provided on the first global data line GD1, to the first local data line LD1 and the second datum, provided on the second global data line GD2, to the second local data line LD2. In the case of a low level of the control signal ODD, the input circuit IN feeds the first datum to the second local data line LD2 and the second datum to the first local data line LD1.

In the event of an access to the memory, one of the first column select lines CSL0, CSL2, CSL4 of the first cell group 11 and one of the second column select lines CSL1, CSL3, CSL5 of the second cell group 12 are respectively activated simultaneously. Therefore, in the event of each write access, the two items of data which are fed to the input circuit IN are written via the input circuit IN to a respective one of the cell groups 11, 12, each datum being assigned to one of the cell groups in a manner dependent on the control signal ODD.

In the event of a read access, a datum is output simultaneously from each cell group 11, 12 onto the associated local data line LD1, LD2, from where it passes via the switching unit S to the global data lines GD1 and GD2, respectively. In this case, the switching unit S respectively feeds the datum present on the first local data line LD1 to the first global data line GD1 and the datum present on the second local data line LD2 to the second global data line GD2.

The control signal ODD is likewise fed to the output circuit OUT. In the case of a high level of the control signal ODD, that is to say in the case of an even column address CADR the output circuit OUT firstly outputs the datum provided on the first global data line GD1, the datum having been read from the first cell group 11, to the data connection DP. The output circuit subsequently outputs the datum on the second global data line GD2, the datum having been read from the second cell group 12. In the case of a low level of the control signal ODD (odd column address CADR), the output circuit OUT outputs the data provided on the global data lines GD1, GD2 in the opposite order. The outputting of the data at the data connection DP in the event of a read access is effected once again synchronously with the external clock signal CLK, that is to say with a positive and a negative edge of the clock signal.

FIG. 3 shows a few signal profiles for the memory as shown in FIG. 1. The following are illustrated: the external clock signal CLK and a data signal D, which arrives at the data connection DP, is synchronous with the external clock signal CLK and contains first data D1 and second data D2 which are derived from the data signal D by the receiving unit DT. The data signal D contains a datum for each clock edge of the clock signal CLK. The receiving unit DT derives, from the data signal D, the first data D1 occurring with each positive edge of the clock signal CLK and the second data D2 occurring with each negative edge of the clock signal CLK. The first data D1 pass via the first global data line GD1, and the second data D2 via the second global data line GD2, to the input circuit IN, which, in the manner already described further above, performs assignment of the data D1, D2 to the local data lines LD1, LD2 or cell groups 11, 12.

Conversely, in the event of a read access to the memory, data D1, D2, as are shown in FIG. 3, are read out via the switching unit S onto the global data lines GD1, GD2. In a manner dependent on the control signal ODD, the output circuit OUT then outputs the data D1, D2 in the form of the data signal D illustrated in the second row in FIG. 3, or in the form of the data signal D' illustrated in the last row in FIG. 3. Whereas, in the case of the data signal D, firstly one of the first items of data D1 is output with each rising edge of the clock signal CLK and one of the second items of data D2 is output with each falling edge, the situation is reversed in the case of the data signal D'.

Figure 5:
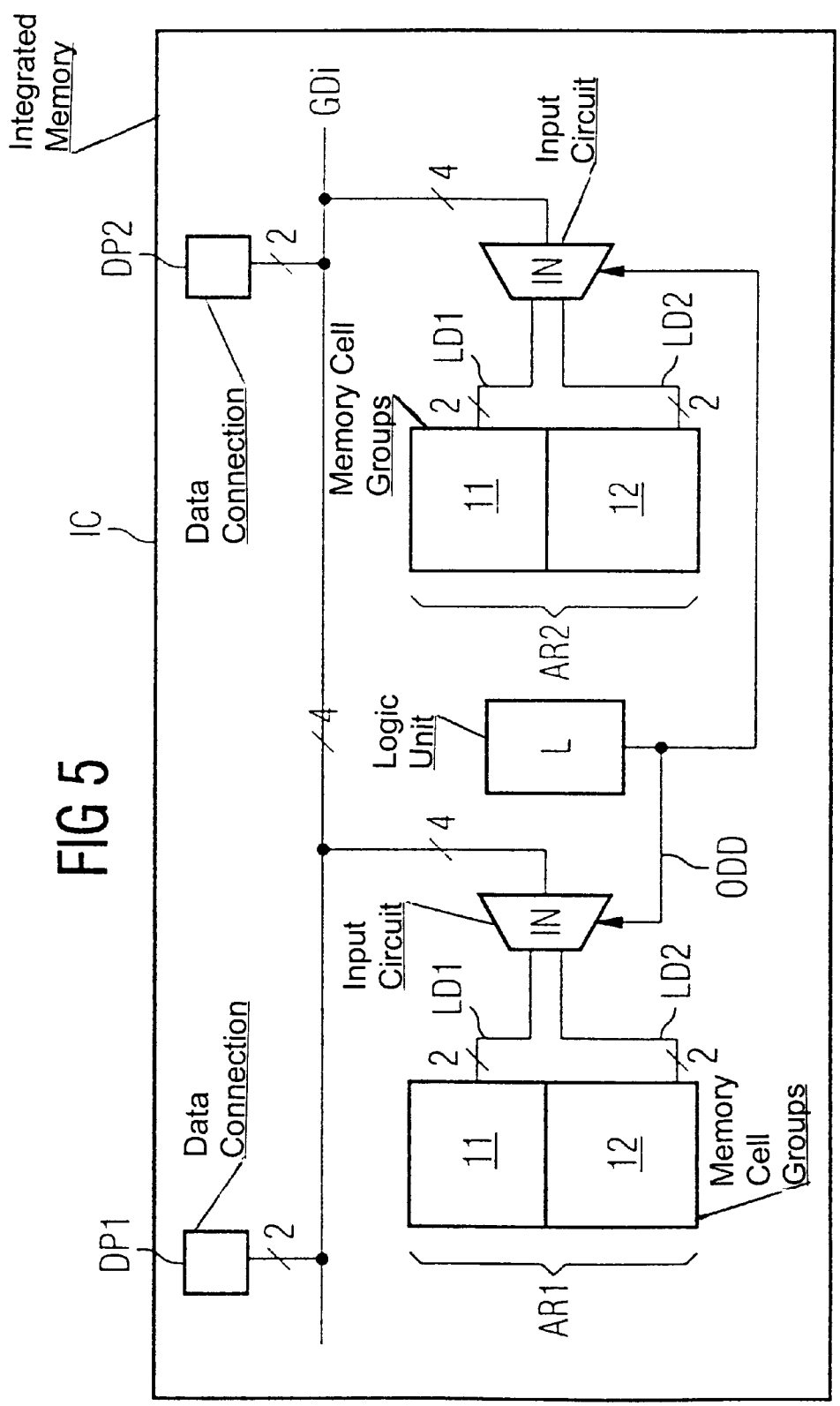
FIG. 5 is a schematic block diagram of a further alternative embodiment of an integrated memory according to the invention.

FIG. 5 shows a variant of the exemplary embodiment of FIG. 1. This embodiment has a large number of data connections DP1, DP2, only two of which have been illustrated. For reasons of clarity, components that are likewise present in this exemplary embodiment, such as the output circuit OUT, the receiving unit D2 and the switching unit S, have not been illustrated. The memory IC in FIG. 5 has two memory cell arrays AR1, AR2 each having two cell groups 11, 12 of the type described with reference to FIG. 1. Each memory cell array is assigned a respective input circuit IN, which is connected to respective two associated cell groups 11, 12 via in each case two local data lines LDi. The data connections DP1, DP2 are connected to the input circuit IN via a data bus formed by the global data lines GDi. The assignment of the data pairs, arriving with each clock edge of the external clock signal CLK in the event of a read access, to the cell groups 11, 12 is effected via the input circuits IN once again in a manner dependent on the control signal ODD. FIG. 5 reveals that the input circuits IN which carry out the assignment are each provided adjacent to the cell arrays AR1, AR2. By contrast, the output circuits OUT, which are not illustrated in FIG. 5, for each data connection DP1, DP2 are provided directly adjacent to the latter.

FIG. 4 shows another embodiment of an integrated memory IC, in which, in contrast to the exemplary embodiments as shown in FIG. 1 and FIG. 5, the receiving unit DT is not provided adjacent to the data connection DP but likewise adjacent to the cell array AR and hence directly in front of or upstream of the input circuit IN. The data connection DP is connected to the receiving unit DT via a circuit RC and a line L. In the event of a write access, the circuit RC forwards the data arriving at the data connection DP unchanged via the line L to the receiving unit DT. The latter forwards the first datum, arriving with a positive edge of the external clock signal CLK, onto a line A and the second datum, arriving with a negative edge onto a line B, which are connected to the inputs of the input circuit IN. Then, as already described above, the input circuit IN performs an assignment of the data provided on the lines A, B to the cell groups 11, 12 in a manner dependent on the control signal ODD.

In the case of the memory of FIG. 4, then, each data connection DP is connected to the memory cell arrays AR via three unidirectional lines L, L1, L2. The line L serves for transferring data only during a write access, and the two lines L1, L2 serve for it only in the event of a read access. Just like the exemplary embodiments as shown in FIG. 1 and FIG. 5, the input circuit IN is provided directly adjacent to the cell groups 11, 12 in the memory as shown in FIG. 4.

The input circuit IN in FIG. 1 has a further control input C. In the case of a specific level at this control input C, the input circuit IN forwards the same datum, namely the datum which is provided on the first global data line GD1 in the event of the write access, onto both local data lines LD1, LD2. The memory as shown in FIG. 5 may also have input circuits IN with this option, so that they are able to transfer the datum provided on the first global data line GD1 simultaneously to the two local data lines LD1, LD2 and hence into both cell groups 11, 12.

The input circuits IN of the exemplary embodiments illustrated here are provided directly adjacent to the cell groups 11, 12 and hence directly adjacent to the transistors Ti from FIG. 2. Consequently, the assignment of the data that are fed to the memory in the event of a read access takes place as late as possible, in other words immediately before the feeding to the memory cells MC. The input circuits IN are thus provided directly in front of or directly upstream of the column decoding of the cell groups 11, 12.

We claim:

1. An integrated memory, comprising:

a bidirectional data connection;

two cell groups located adjacent to one another and having memory cells;

a first local data line and a second local data line for a respective bidirectional data transfer from and to said memory cells of a respective one of said two cell groups;

a first global data line and a second global data line for a respective bidirectional data transfer between said data connection and said first and second local data lines;

an output circuit for performing a read access to said two cell groups, said output circuit being located adjacent to said data connection;

said first and second global data lines being connected to said data connection via said output circuit, said output circuit having two operating states for feeding two items of data respectively provided on said first and second global data lines to said data connection in a respective different order;

an input circuit for performing a write access to said two cell groups, said input circuit being located adjacent to said two cell groups;

a receiving unit located at said data connection;

said data connection being connected to said first and second global data lines via said receiving unit, said data connection, in the event of the write access to said two cell groups, being fed a first datum and subsequently a second datum, said receiving unit, in the event of the write access, feeding the first datum to said first global data line and feeding the second datum to said second global data line; and said first and second global data lines being connected to said first and second local data lines via said input circuit, said input circuit having two operating states for feeding the first datum and the second datum in a respectively different assignment to said first and second local data lines.

2. The integrated memory according to claim 1, including:

a logic unit for providing a control signal; and said output circuit and said input circuit having respective control inputs for receiving the control signal, the operating states of said output circuit and of said input circuit being dependent on the control signal.

3. The integrated memory according to claim 1, including:

switching elements having respective control connections;

said two cell groups having word lines and bit lines forming cross-over points, said memory cells being provided at said cross-over points, said bit lines of each of said two cell groups being connected to an associated one of said first and second local data lines;

first column select lines and second column select lines, a first one said two cell groups being assigned said first column select lines and a second one of said two cell groups being assigned said second column select lines, a respective one of said first and second column select lines being activated in the event of one of the write access and the read access to said two cell groups; and said first column select lines and said second column select lines being connected to respective ones of said control connections of said switching elements.

4. The integrated memory according to claim 3, wherein said first and second column select lines are addressed through the use of column addresses, said first column select lines are assigned even ones of the column addresses and said second column select lines are assigned odd ones of the column addresses.

5. The integrated memory according to claim 1, including a clock connection for providing a clock signal having two successive edges, said data connection being configured such that the two items of data, transferred via said data connection in the event of the read access and in the event of the write access, are synchronous with the two successive edges of the clock signal.

6. The integrated memory according to claim 5, wherein said clock connection provides a positive edge and a negative edge as the two successive edges of the clock signal.

7. The integrated memory according to claim 1, wherein said input circuit has a given operating state, said input circuit, when being in the given operating state, feeds the first datum simultaneously to both of said first and second local data lines in the event of the write access.

* * * * *